United States Patent [19]

Sandhu et al.

[11] Patent Number: 6,017,789

[45] Date of Patent: *Jan. 25, 2000

[54] METHOD OF FORMING A $TA_2O_5$ DIELECTRIC LAYER WITH AMORPHOUS DIFFUSION BARRIER LAYER AND METHOD OF FORMING A CAPACITOR HAVING A $TA_2O_5$ DIELECTRIC LAYER WITH AMORPHOUS DIFFUSION BARRIER LAYER

[75] Inventors: Gurtej S. Sandhu; Pierre C. Fazan, both of Boise, Id.

[73] Assignee: Micron Technology, Inc., Boise, Id.

[ * ] Notice: This patent is subject to a terminal disclaimer.

[21] Appl. No.: 08/881,561

[22] Filed: Jun. 24, 1997

Related U.S. Application Data

[63] Continuation of application No. 08/444,853, May 19, 1995, Pat. No. 5,663,088.

[51] Int. Cl.$^7$ .............................................. H01L 21/8242
[52] U.S. Cl. ........................... 438/240; 438/785; 257/310
[58] Field of Search ................................... 438/240, 785; 257/310

[56] References Cited

U.S. PATENT DOCUMENTS

| | | | |
|---|---|---|---|
| 5,057,447 | 10/1991 | Paterson | 437/43 |
| 5,082,797 | 1/1992 | Chan et al. | 437/52 |
| 5,142,438 | 8/1992 | Reinberg et al. | 437/52 |
| 5,162,248 | 11/1992 | Dennison et al. | 437/52 |
| 5,187,557 | 2/1993 | Zenke | |
| 5,192,589 | 3/1993 | Sandhu | 427/255.1 |
| 5,234,857 | 8/1993 | Kim et al. | 437/47 |
| 5,246,881 | 9/1993 | Sandhu et al. | 437/192 |

(List continued on next page.)

FOREIGN PATENT DOCUMENTS

| | | |
|---|---|---|
| 0551117 | 7/1993 | European Pat. Off. . |
| 01094645 | 4/1989 | Japan . |
| 1-222469 | 9/1989 | Japan . |
| 05243486 | 9/1993 | Japan . |
| WO 86/01640 | 3/1986 | WIPO . |

OTHER PUBLICATIONS

Eizenberg et al., "TiCN: A new chemical vapor deposited contact barrier metallization of submicron devices"; Applied Physics Letters, vol. 65, No. 19; pp. 2416–2418, Nov. 1994.

H. Watanabe, et al. "A New Cylindrical Capacitor Using Hemispherical Crained SI (HSG–Si) for 256Mb DRAMs", Apr. 1992 IEEE pp. 259–262.

Aoki, Hidemitsu et al., Jpn. J. Appl. Phys. 32, 376 (Jan. 1993).

(List continued on next page.)

*Primary Examiner*—John F. Niebling
*Assistant Examiner*—John Murphy
*Attorney, Agent, or Firm*—Wells, St. John, Roberts Gregory & Matkin P.S.

[57] ABSTRACT

A method of forming a dielectric layer includes, a) chemical vapor depositing a dielectric layer of $Ta_2O_5$ atop a substrate; and b) providing a predominately amorphous diffusion barrier layer over the $Ta_2O_5$ dielectric layer. A method of forming a capacitor includes, a) providing a node to which electrical connection to a capacitor is to be made; b) providing a first electrically conductive capacitor plate over the node; c) chemical vapor depositing a capacitor dielectric layer of $Ta_2O_5$ over the first electrically conductive capacitor plate; and d) providing a predominately amorphous diffusion barrier layer over the $Ta_2O_5$ dielectric layer. A capacitor construction is also disclosed. The preferred amorphous diffusion barrier layer is electrically conductive and constitutes a metal organic chemical vapor deposited $TiC_xN_yO_z$, where "x" is in the range of from 0.01 to 0.5, and "y" is in the range of from 0.99 to 0.5, and "z" is in the range of from 0 to 0.3, with the sum of "x", "y" and "z" equalling about 1.0. Such is preferably deposited by utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

11 Claims, 2 Drawing Sheets

U.S. PATENT DOCUMENTS

| | | | |
|---|---|---|---|
| 5,278,091 | 1/1994 | Fazan et al. | 437/52 |
| 5,279,985 | 1/1994 | Kamiyama | 438/396 |
| 5,302,540 | 4/1994 | Ko et al. | 427/585 |
| 5,324,679 | 6/1994 | Kim et al. | 437/47 |
| 5,338,700 | 8/1994 | Dennison et al. | 437/60 |
| 5,340,763 | 8/1994 | Dennison et al. | 437/52 |
| 5,340,765 | 8/1994 | Dennison et al. | 437/52 |
| 5,348,894 | 9/1994 | Gnade et al. | 437/12 |
| 5,471,364 | 11/1995 | Summerfelt et al. | 361/321.4 |
| 5,471,418 | 11/1995 | Tanigawa | 365/149 |
| 5,489,548 | 2/1996 | Nishioka et al. | 437/60 |
| 5,504,041 | 4/1996 | Summerfelt et al. | 437/225 |
| 5,571,572 | 11/1996 | Sandhu | 427/585 |
| 5,665,431 | 9/1997 | Narasimhan | 427/255 |

OTHER PUBLICATIONS

T. Kamiyama et al., IEDM Tech. Dig., Sep. 1991, 827.

P.C. Fazan, et al., IEDM Tech. Dig., Apr. 1992, 263.

L.R. Doolittle, et al., Nucl. Instrum. Methods, B 15, 227 (1986). Month unavailable.

G.S. Sandhu, et al., Appl. Phys. Lett., 62, 240 (Jan. 1993).

Ishihara, K. et al., Characterization of CVD–TiN Films Prepared with Metalorganic Source, vol. 29, No. 10, Oct., 1990, pp. 2103–2105.

Katz, A. et al., The Immunence of Ammonia on rapid–thermal low–pressure metalorganic chemical vapor deposited $TiN_x$ films from tetrakis (dimethylamido) titanium precursor onto InP, J. Appl. Phys. 7(2), Jan. 15, 1992, pp. 993–1000.

Zaima, et al., Conduction Mechanism of Leakage Current in $TA_2O_5$ Film on Si Prepared by LPCVD, pp 2876–2879, Journal Electrochemical Society, vol. 137, No. 9, Sep. 1990.

METHOD OF FORMING A TA$_2$O$_5$ DIELECTRIC LAYER WITH AMORPHOUS DIFFUSION BARRIER LAYER AND METHOD OF FORMING A CAPACITOR HAVING A TA$_2$O$_5$ DIELECTRIC LAYER WITH AMORPHOUS DIFFUSION BARRIER LAYER

RELATED PATENT DATA

This patent resulted from a continuation application of U.S. patent application Ser. No. 08/444,853, filed on May 19, 1995, entitled "Method Of Forming A Ta$_2$O$_5$ Dielectric Layer, Method Of Forming A Capacitor Having A Ta$_2$O$_5$ Dielectric Layer, And Capacitor Construction", now U.S. Pat. No. 5,663,088.

TECHNICAL FIELD

This invention relates to methods of forming a capacitor having a Ta$_2$O$_5$ dielectric layer, to methods of forming a Ta$_2$O$_5$ dielectric layer, and to capacitor constructions.

BACKGROUND OF THE INVENTION

As DRAMs increase in memory cell density, there is a continuing challenge to maintain sufficiently high storage capacitance despite decreasing cell area. Additionally, there is a continuing goal to further decrease cell area. One principal way of increasing cell capacitance is through cell structure techniques. Such techniques include three-dimensional cell capacitors, such as trenched or stacked capacitors. Yet as feature size continues to become smaller and smaller, development of improved materials for cell dielectrics as well as the cell structure are important. The feature size of 256 Mb DRAMs will be on the order of 0.25 micron, and conventional dielectrics such as SiO$_2$ and Si$_3$N$_4$ might not be suitable because of small dielectric constants.

Chemical vapor deposited (CVD) Ta$_2$O$_5$ films are considered to be very promising cell dielectrics layers, as the dielectric constant of Ta$_2$O$_5$ is approximately three times that of Si$_3$N$_4$. Proposed prior art capacitor constructions include the use of Ta$_2$O$_5$ as a capacitor dielectric layer, in combination with an overlying predominately crystalline TiN electrode or other layer. However, diffusion relative to the tantalum layer is problematic in the resultant capacitor construction. For example, tantalum from the Ta$_2$O$_5$ tends to undesirably out-diffuse from the dielectric layer. Further, materials from the adjacent conductive capacitor plates can diffuse into the tantalum layer. In either event, the dielectric properties of the Ta$_2$O$_5$ layer are adversely affected in a less than predictable or an uncontrollable manner.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a capacitor includes the following steps:

providing a node to which electrical connection to a capacitor is to be made;

providing a first electrically conductive capacitor plate over the node;

chemical vapor depositing a capacitor dielectric layer of Ta$_2$O$_5$ over the first electrically conductive capacitor plate; and providing a predominately amorphous diffusion barrier layer over the Ta$_2$O$_5$ dielectric layer.

In accordance with another aspect of the invention, a method of forming a dielectric layer comprises the following steps:

chemical vapor depositing a dielectric layer of Ta$_2$O$_5$ atop a substrate; and providing a predominately amorphous diffusion barrier layer over the Ta$_2$O$_5$ dielectric layer.

In accordance with still a further aspect of the invention, a capacitor comprises:

a first electrically conductive capacitor plate;

a capacitor dielectric layer adjacent the first electrically conductive capacitor plate, the capacitor dielectric layer comprising Ta$_2$O$_5$;

a predominately amorphous diffusion barrier adjacent the Ta$_2$O$_5$ dielectric layer; and a second electrically conductive capacitor plate, the Ta$_2$O$_5$ dielectric layer being positioned between the first and second electrically conductive plates.

Figure 1:
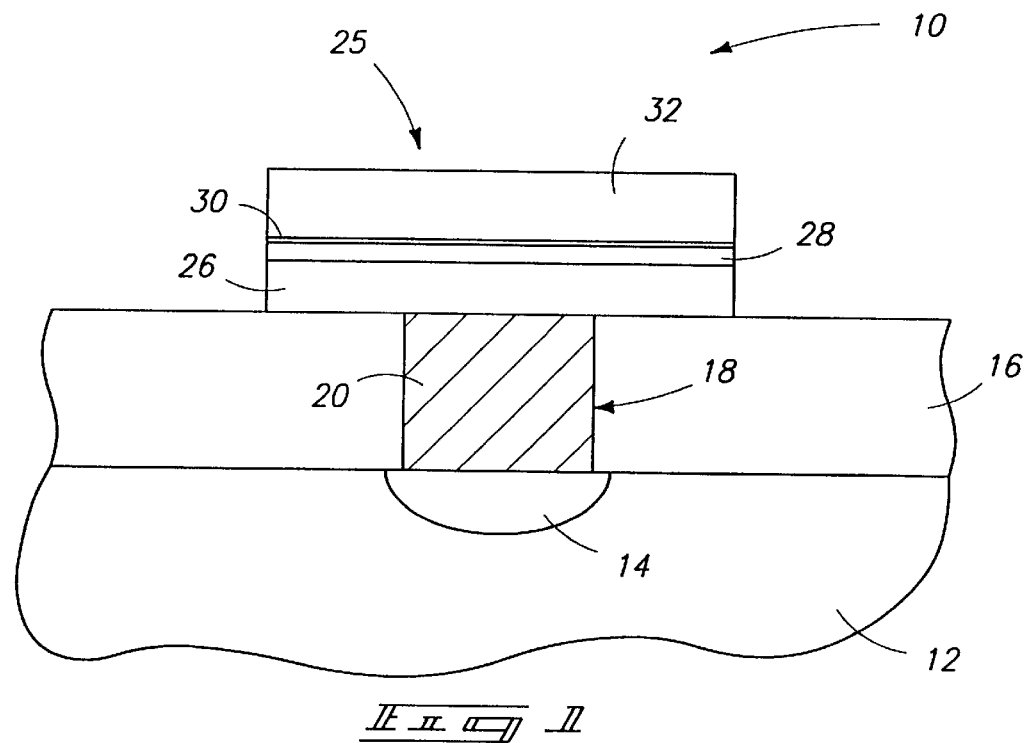
FIG. 1 is a diagrammatic sectional view of a semiconductor wafer fragment in accordance with the invention.

More particularly and first with reference to FIG. 1, a semiconductor wafer fragment is indicated generally with reference numeral 10. Such comprises a bulk silicon substrate 12 having a conductive diffusion area 14 formed therein. An insulating layer 16, typically borophosphosilicate glass (BPSG), is provided over substrate 12, with a contact opening 18 having been previously provided therein to diffusion area 14. A conductive material 20 fills contact opening 18, with material 20 and oxide layer 16 having been planarized as shown. Material 20 might be any suitable conductive material, such as tungsten or conductively doped polysilicon. A capacitor construction 25 is provided atop layer 16 and plug 20, with conductive plug 20 constituting a node to which electrical connection to capacitor 25 is made.

Capacitor 25 comprises a first electrically conductive capacitor plate 26 which has been provided and patterned over node 20. An example and preferred material is conductively doped polysilicon, provided to a thickness of 1000 Angstroms for 256 Mb density. A capacitor dielectric layer 28 of Ta$_2$O$_5$ is provided over first electrically conductive capacitor plate 26. An example process for depositing layer 28 is by low pressure chemical vapor deposition at 450° C. using Ta(OC$_2$H$_5$)$_5$ and oxygen as precursors. Ta(OC$_2$H$_5$)$_5$ can be vaporized at 170° C., and introduced into a reactor chamber using argon or another suitable carrier gas. Subsequently, densification by rapid thermal annealing in a dry oxygen atmosphere at a temperature ranging from 700° C. to 900° C. is utilized. Preferably, the polysilicon surface of lower capacitor plate 26 is cleaned by an in situ HF dip prior to provision of the Ta$_2$O$_5$. Rapid thermal nitrogen treatment can also be carried out immediately prior to Ta$_2$O$_5$ deposition, such as at 900° C. for 60 seconds in NH$_3$. An example and preferred thickness for layer 28 in accordance with 256 Mb integration is 100 Angstroms.

A predominately amorphous diffusion barrier layer 30 is provided over Ta$_2$O$_5$ dielectric layer 28. Such layer is preferably electrically conductive, with an example and preferred thickness for 256 Mb integration being 200 Angstroms. A most preferred material for layer 30 is predominately amorphous $TiC_xN_yO_z$ deposited by metal organic chemical vapor deposition (MOCVD), where "x" is in the range of from 0.01 to 0.5, and "y" is in the range of from 0.99 to 0.5, and "z" is in the range of from 0 to 0.3, with the sum of "x", "y" and "z" equalling about 1.0. A preferred metal organic precursor for such deposition is $Ti(NR_2)_4$, where R is selected from the group consisting of H and a carbon containing radical. Deposition conditions for producing such a predominately amorphous layer include from 200° C. to 600° C., and from 0.1 to 100 Torr. Most preferably, the amorphous diffusion barrier layer comprises a material which is a barrier to out-diffusion of tantalum from the $Ta_2O_5$ layer. The preferred $TiC_xN_yO_z$ material provides this function.

Also most preferably, "z" will be equal to zero. Unfortunately however, oxygen can undesirably become incorporated in the deposited film when it is exposed to oxygen, even ambient air. This incorporated oxygen undesirably affects conductivity. Accordingly, exposure to oxygen is preferably minimized until the subject film is covered by subsequent layers which can effectively act as a barrier to oxygen incorporation.

Subsequently, a second electrically conductive capacitor plate 32 is provided outwardly of diffusion barrier layer 30, such that $Ta_2O_5$ dielectric layer 28 is positioned between the first and second electrically conductive plates. Accordingly, second electrically conductive capacitor plate 32 constitutes a discrete, second electrically conductive capacitor plate provided over the amorphous diffusion barrier layer 30. An example and preferred material for second capacitor plate 32 is polysilicon, with 1000 Angstroms being an example preferred thickness for 256 Mb integration.

Prior art constructions and proposals for utilizing $Ta_2O_5$ as a capacitor dielectric layers suffer from the drawback of undesired out-diffusion of tantalum atoms from such layer, or diffusion of undesired components into such layer. Provision of a thin predominately amorphous diffusion barrier layer as described above in the preferred embodiment facilitates maintaining integrity of the $Ta_2O_5$ layer and, accordingly, its associated desired high dielectric constant in such a small application. It has been discovered in the context of the invention that amorphous materials are better diffusion barriers due to absence of crystal grain boundaries which can provide an easy path for diffusion in polycrystalline materials.

Figure 2:
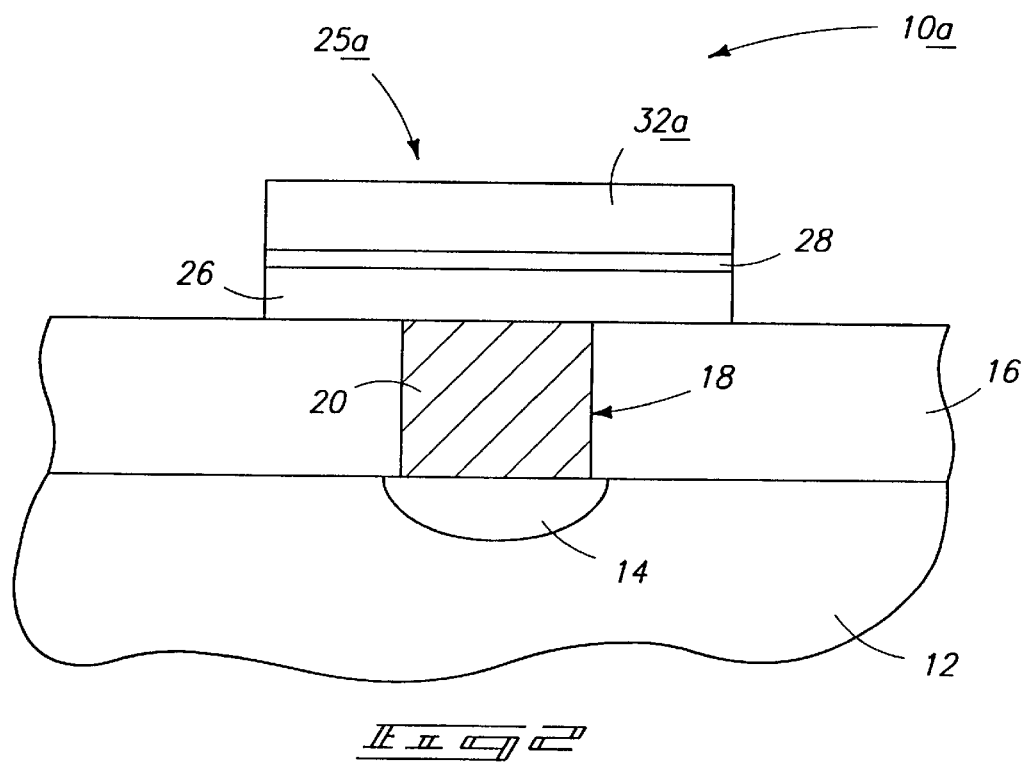
FIG. 2 is a diagrammatic sectional view of an alternate embodiment semiconductor wafer fragment in accordance with the invention.

FIG. 2 illustrates an alternate embodiment capacitor construction and method in accordance with the invention. Like numerals from FIG. 1 have been utilized where appropriate, with differences being indicated by either different numerals, or like numerals with the suffix "a". Wafer fragment 10a comprises a capacitor construction 25a differing from the first described embodiment in provision of a predominately amorphous, electrically conductive second capacitor plate 32a which functions as an inherent amorphous diffusion barrier layer. The preferred material is the previously described metal organic chemical vapor deposited $TiC_xN_yO_z$ which is provided to a thickness which is effective to form the predominant portion (the entire portion, as shown) of second electrically conductive capacitor plate 32a. Alternately, both Hates 32 and 26 might be provided to constitute a conductive inherently morphous diffusion barrier layer, such as the MOCVD $TiC_xN_yO_z$.

Figure 3:
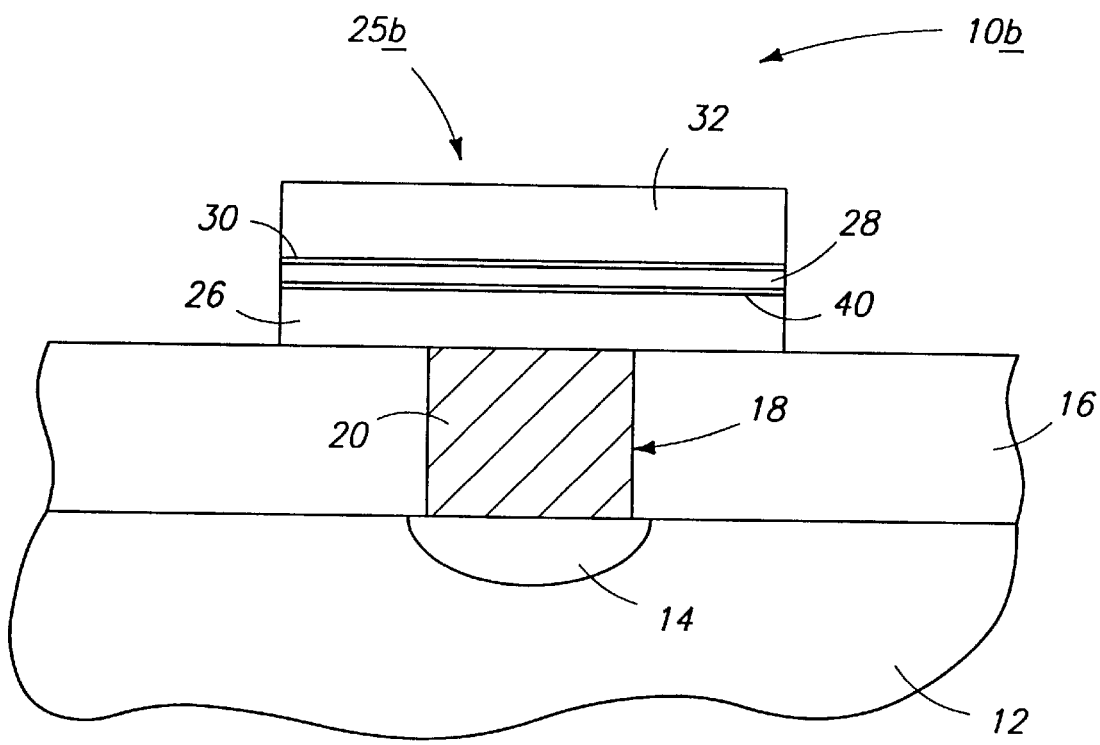
FIG. 3 is a diagrammatic sectional view of yet another alternate embodiment semiconductor wafer fragment in accordance with the invention.

FIG. 3 illustrates yet another alternate embodiment capacitor construction and method. Again, like numerals from the first described embodiment are utilized where appropriate, with differences being indicated by different numerals or with the suffix "b". Wafer fragment 10b includes a capacitor construction 25b having the same first and second capacitor plates 26 and 32, respectively, of the first described embodiment. However, a pair of predominately amorphous diffusion barrier layers 30 and 40 are provided to encapsulate $Ta_2O_5$ dielectric layer 28 to prevent tantalum out-diffusion.

The invention was reduced to practice in a study of three types of rapid thermal nitrogen annealed polysilicon films having $Ta_2O_5$ films thereatop, with different overlying titanium nitride or titanium carbonitride layers being deposited. The inventive constructions were deposited by metal organic chemical vapor deposition of a $TiC_xN_yO_z$ film deposited from tetrakisdimethylamido titanium (TDMAT) at 450° C., and 0.5 Torr in a cold wall chemical vapor deposition reactor. These wafers were compared with two non-inventive deposited titanium nitride layers. These two non-invention layers were deposited by chemical vapor deposition and by sputtering, respectively. The CVD TiN films were formed by reacting $TiCl_4$ and $NH_3$ at 600° C. (i.e., non-MOCVD) in a low pressure chemical vapor deposition reactor. The sputtered TiN films were formed by reactive sputtering of Ti in an Ar—$N_2$ ambient at 14 Torr. The substrates were heated to 400° C. during deposition. On top of the CVD TiN film, and also on the inventive MOCVD films, an. additional capping layer of sputtered TiN was deposited for protection against oxidation during plasma steps used to remove photoresist. The sputter deposited and CVD TiN films using $TiCl_4$ and $NH_3$ were crystalline, while the MOCVD films of the invention are substantially amorphous.

Four samples of each group were prepared, out of which three were annealed at 700° C., 800° C. and 900° C. for thirty minutes at $7 \times 10^{-6}$ Torr. With respect to the control CVD TiN films, out-diffusion of Ta into this crystalline TiN layer was observed, and to increase with increasing annealing temperature. Also with the crystalline sputtered TiN films, significant out-diffusion of tantalum into the TiN layer was observed after the 900° C. anneal.

With the amorphous MOCVD $TiC_xN_yO_z$ films, no out-diffusion of tantalum was observed. Twenty atomic percent of carbon and oxygen were however detected in the film. Yet, the absence of interaction of the MOCVD $TiC_xN_yO_z$ layers with the dielectric $Ta_2O_5$ up to 900° C. makes such composite layers attractive candidates for capacitor and other dielectric layers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a capacitor comprising the following steps:

forming a first electrically conductive capacitor plate over a substrate;

forming a capacitor dielectric layer of $Ta_2O_5$ over the first electrically conductive capacitor plate;

forming a predominately amorphous diffusion barrier layer to tantalum diffusion over the $Ta_2O_5$ dielectric layer; and forming a discrete, second electrically conductive capacitor plate over the amorphous diffusion barrier layer.

2. A method of forming a capacitor comprising the following steps:

forming a first electrically conductive capacitor plate over a substrate;

forming a capacitor dielectric layer of $Ta_2O_5$ over the first electrically conductive capacitor plate;

forming a predominately amorphous diffusion barrier layer to tantalum diffusion over the $Ta_2O_5$ dielectric layer by metal organic chemical vapor depositing a $TiC_xN_yO_z$ layer over the $Ta_2O_5$, where "x" is in the range of from 0.01 to 0.5, and "y" is in the range of from 0.99 to 0.5, and "z" is in the range of from 0 to 0.3, with the sum of "x", "y" and "z" equalling about 1.0.

3. The method of forming a capacitor of claim 2 wherein the step of metal organic chemical vapor depositing $TiC_xN_yO_z$ comprises utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

4. The method of forming a capacitor of claim 3, further comprising providing a discrete, second electrically conductive capacitor plate over the amorphous diffusion barrier layer.

5. The method of forming a capacitor of claim 2, further comprising providing a discrete, second electrically conductive capacitor plate over the amorphous diffusion barrier layer.

6. A method of forming a dielectric layer comprising the following steps:

forming a dielectric layer of $Ta_2O_5$ atop a substrate; and forming a predominately amorphous diffusion barrier layer to tantalum over the $Ta_2O_5$ dielectric layer, the diffusion barrier layer comprising $TiC_xN_yO_z$, where the sum of "x", "y" and "z" equals about 1, and wherein "x" is greater than zero.

7. The method of forming a dielectric layer of claim 6 wherein the amorphous diffusion barrier layer is provided to be a barrier to out diffusion of tantalum from the $Ta_2O_5$ layer.

8. The method of forming a dielectric layer of claim 6 wherein the amorphous diffusion barrier layer is provided to be electrically conductive.

9. The method of forming a dielectric layer of claim 6 wherein the step of forming the amorphous diffusion barrier layer comprises metal organic chemical vapor depositing $TiC_xN_yO_z$ layer over the $Ta_2O_5$, where "x" is in the range of from 0.01 to 0.5, and "y" is in the range of from 0.99 to 0.5, and "z" is in the range of from 0 to 0.3, with the sum of "x", "y" and "z" equalling about 1.0.

10. The method of forming a dielectric layer of claim 6 wherein the step of forming the amorphous diffusion barrier layer comprises metal organic chemical vapor depositing a $TiC_xN_yO_z$ layer over the $Ta_2O_5$, where "x" is in the range of from 0.01 to 0.5, and "y" is in the range of from 0.99 to 0.5, and "z" is in the range of from 0 to 0.3, with the sum of "x", "y" and "z" equalling about 1.0; and the step of metal organic chemical vapor depositing $TiC_xN_yO_z$ comprises utilizing a gaseous titanium organometallic precursor of the formula $Ti(NR_2)_4$, where R is selected from the group consisting of H and a carbon containing radical, and utilizing deposition conditions of from 200° C. to 600° C. and from 0.1 to 100 Torr.

11. A method of forming a capacitor comprising the following steps:

forming a first electrically conductive capacitor plate over a substrate, the first electrically conductive capacitor plate comprising conductively doped polysilicon;

forming a capacitor dielectric layer of $Ta_2O_5$ over the first electrically conductive capacitor plate; and forming a diffusion barrier layer to Ta diffusion over the $Ta_2O_5$ dielectric layer, the diffusion barrier layer comprising $TiC_x$, wherein "x" is greater than 0.

* * * * *

UNITED STATES PATENT AND TRADEMARK OFFICE
CERTIFICATE OF CORRECTION

PATENT NO : 6,017,789
DATED : January 25, 2000
INVENTOR(S) : Gurtej S. Sandhu et al.

It is certified that error appears in the above-identified patent and that said Letters Patent are hereby corrected as shown below:

Col. 3, line 63
 replace "Hates"
 with --plates--.

Signed and Sealed this

Twenty-seventh Day of March, 2001

Attest:

NICHOLAS P. GODICI

Attesting Officer    Acting Director of the United States Patent and Trademark Office